United States Patent
Lin et al.

(10) Patent No.: US 10,986,587 B2
(45) Date of Patent: Apr. 20, 2021

(54) CONTROLLING RADIO FREQUENCY (RF) OUTPUT POWER OF ANTENNAS

(71) Applicant: HEWLETT-PACKARD DEVELOPMENT COMPANY, L.P., Spring, TX (US)

(72) Inventors: Chao-Chiang Lin, Taipei (TW); Rahul V. Lakdawala, Houston, TX (US)

(73) Assignee: Hewlett-Packard Development Company, L.P., Spring, TX (US)

(*) Notice: Subject to any disclaimer, the term of this patent is extended or adjusted under 35 U.S.C. 154(b) by 0 days.

(21) Appl. No.: 16/889,440

(22) Filed: Jun. 1, 2020

(65) Prior Publication Data

US 2020/0296676 A1 Sep. 17, 2020

Related U.S. Application Data

(63) Continuation of application No. 16/479,235, filed as application No. PCT/US2017/043715 on Jul. 25, 2017, now Pat. No. 10,716,072.

(51) Int. Cl.
| | |
|---|---|
| *H04W 52/28* | (2009.01) |
| *H01J 37/32* | (2006.01) |
| *H04W 52/36* | (2009.01) |

(52) U.S. Cl.
CPC ....... *H04W 52/28* (2013.01); *H01J 37/32174* (2013.01); *H04W 52/367* (2013.01)

(58) Field of Classification Search
CPC . H04W 52/283; H04W 52/28; H04W 52/367; H04W 4/38; H04W 52/00
See application file for complete search history.

(56) References Cited

U.S. PATENT DOCUMENTS

| | | | |
|---|---|---|---|
| 8,848,932 B2 | 9/2014 | Poulsen et al. | |
| 8,995,938 B2 | 3/2015 | Ali et al. | |
| 9,110,118 B2 | 8/2015 | Tillotson | |
| 9,325,080 B2 | 4/2016 | Ouyang | |
| 9,654,846 B2 | 5/2017 | Sindia | |
| 2009/0305742 A1 | 12/2009 | Caballero | |
| 2012/0164962 A1 | 6/2012 | Lin | |
| 2013/0217342 A1 | 8/2013 | Abdul-Gaffoor | |
| 2015/0025827 A1 | 1/2015 | Teissier | |

(Continued)

OTHER PUBLICATIONS

Erik Tobler, "Self-diagnosis" How self-monitoring sensors can help boost safety and save time, Jan. 19, 2017 (5 pages).

(Continued)

*Primary Examiner* — Keith Ferguson
(74) *Attorney, Agent, or Firm* — HPI Patent Department

(57) ABSTRACT

In some examples, an apparatus includes a proximity sensor to detect a presence of a nearby object, wherein the proximity sensor to output a detection signal. The apparatus includes a physical signal filter unit (PSFU) comprising a plurality of filters, the PSFU to filter the detection signal to produce respective filtered detection signals, wherein a combination of states of the filtered detection signals indicates that the proximity sensor is in a malfunctioned condition, and generate a control signal based on the filtered detection signals. The apparatus includes a network controller to control the RF output power of the antenna based on the control signal.

16 Claims, 10 Drawing Sheets

(56) References Cited

U.S. PATENT DOCUMENTS

| | | | |
|---|---|---|---|
| 2015/0200444 A1* | 7/2015 | Mercer | H01Q 1/24 343/702 |
| 2016/0124574 A1 | 5/2016 | Rouaissia et al. | |
| 2016/0164563 A1* | 6/2016 | Khawand | H04W 52/221 455/127.2 |

OTHER PUBLICATIONS

Graham Prophet, "Proximity Sensor Controls Rf Exposure from Smartphones and Tablets", Nov. 13, 2015 (1 page).

* cited by examiner

CONTROLLING RADIO FREQUENCY (RF) OUTPUT POWER OF ANTENNAS

CROSS REFERENCE TO RELATED APPLICATIONS

This is a continuation of U.S. application Ser. No. 16/479,235, having a national entry date of Jul. 19, 2019, which is a national stage application under 35 U.S.C. § 371 of PCT/US2017/043715, filed Jul. 25, 2017, which are both hereby incorporated by reference in their entirety.

BACKGROUND

Computing devices, such as mobile phones and laptops have become ubiquitous part of everyone's life. The computing devices are often connected to multiple networks, wirelessly. These computing devices incorporate different antennas to connect to different networks. Many computing devices also utilize proximity sensors to detect presence of a nearby object to regulate the functioning of the computing device.

BRIEF DESCRIPTION OF DRAWINGS

The detailed description is provided with reference to the accompanying figures. In the figures, the left-most digit(s) of a reference number identifies the figure in which the reference number first appears. The same numbers are used throughout the drawings to reference like features and components.

DETAILED DESCRIPTION

Figure 1:
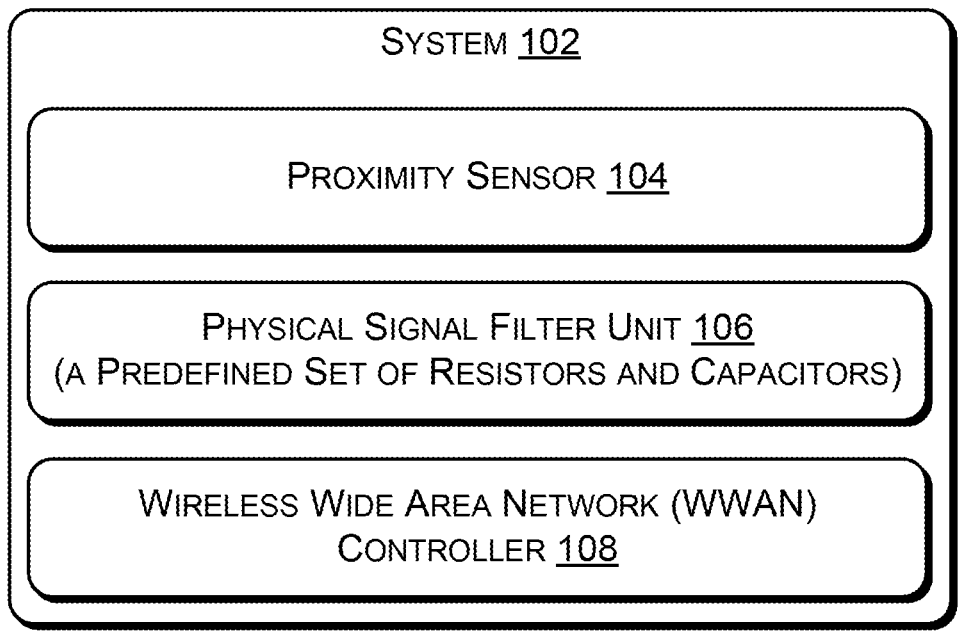
FIG. 1 illustrates a system to regulate a radio frequency (RF) output power of an antenna, according to an example implementation of the present subject matter.

Generally, a computing device includes different antennas to communicate wirelessly with other computing devices over different networks via radio frequency (RF). A permissible RF output power of such computing devices is defined by regulatory authorities of different jurisdictions to avoid interferences among various frequency bands, and to minimize risk to the users due to exposure to RF energy.

In many jurisdictions, the RF output power transmitted by such computing devices is also regulated based on their proximity to a human body. That is, when the computing device is closer to the human body, the RF output power is further curtailed to a lower threshold. To adhere to such regulations, computing devices may utilize a proximity sensor to detect presence of nearby objects and/or users, and accordingly manage antenna controllers of the computing device to regulate the RF output power of the antennas.

However, the proximity sensor of the computing device often malfunctions due to various reasons. Malfunctioning of the proximity sensors causes the computing device to transmit unregulated RF output power even in situations when the computing device is in close proximity to a human body, thereby exposing users to uncontrolled RF energy. While some computing devices include computer programs to regularly poll the proximity sensor to monitor its working state, regular polling consumes a lot of power of the computing device. Moreover, determination of the working state of the proximity sensor also increases the booting time of the computing device, as the working state of the proximity sensor is to be verified every time the computing device is booted.

According to example implementations of the present subject matter, techniques for controlling RF output power of antennas of computing devices are described. In an example, the RF output power of the antenna is controlled based on a state and a condition of the proximity sensor. The state of the proximity sensor is indicative of whether an object is in the vicinity of the computing device. That is, if an object is within the vicinity, the state of proximity sensor is triggered and if there is no object detected in the vicinity, the state of the proximity sensor is not triggered. Similarly, the condition of the proximity sensor may indicate whether the proximity sensor is working properly, or has malfunctioned. Therefore, in an example implementation of the present subject matter, the RF output power of the antenna of the computing device is controlled based on the state and condition of the proximity sensor.

In an example implementation of the present subject matter, a physical signal filter unit (PSFU) is utilized to process signals of the proximity sensor to regulate the RF output power of the computing device. In operation, the PSFU is communicatively coupled to the proximity sensor and includes multiple physical filter circuits with different discharging rates to process the signal of the proximity sensor. The PSFU, implementing physical filter circuits, processes a detection signal generated by the proximity sensor to generate a control signal for controlling the RF output power of the antenna of the computing device. In an example implementation of the present subject matter, the control signal may be provided to a wireless wide area network (WWAN) controller for regulating the RF output power of the computing device. Unlike a control signal generated by a program, the control signal for controlling the RF output power of the antenna generated by the PSFU is resource-efficient.

The implementation of the described example techniques allows the computing device to maintain RF output power within the prescribed limits, even in situations when the proximity sensor malfunctions. Also, since the state of the proximity sensor is determined based on the PSFU, polling of the state of the proximity sensor is not performed, thereby avoiding excess drainage of battery power of the computing device. In addition, booting time of the computing device is also not affected as the proximity sensor check is not performed at every boot cycle of the computing device.

The above techniques are further described with reference to FIG. 1 to FIG. 9. It should be noted that the description and the figures merely illustrate the principles of the present subject matter along with examples described herein and, should not be construed as a limitation to the present subject matter. It is thus understood that various arrangements may be devised that, although not explicitly described or shown herein, embody the principles of the present subject matter. Moreover, all statements herein reciting principles, aspects, and implementations of the present subject matter, as well as specific examples thereof, are intended to encompass equivalents thereof.

FIG. 1 schematically illustrates a system 102 to regulate the RF output power of an antenna, according to an example implementation of the present subject matter. In an example, the system 102 includes a proximity sensor 104, a physical signal filter unit (PSFU) 106, and a Wireless Wide Area Network (WWAN) controller 108.

In an example implementation, the system 102 may be implemented in a computing device, such as a laptop computer, a desktop computer, a notebook, a workstation, a mainframe computer, a server, and the like. Further, the system 102 may be implemented in portable computing devices, such as, hand-held devices, laptops or other portable computers, tablet computers, mobile phones, PDAs, and smartphones.

In an example implementation, the system 102 may communicate with different communication networks, wirelessly, via radio frequency (RF). Further, the proximity sensor 104 may be one of a capacitive proximity sensor, an inductive proximity sensor, a magnetic proximity sensor, a photoelectric proximity sensor. In operation, the proximity sensor 104 may emit and receive one of an electromagnetic field and an oscillating electrical signal for detecting the presence of a nearby object. Further, for detecting the presence of a nearby object within a predefined distance of the proximity sensor 104, the proximity sensor 104 may sense changes in the received signal. In an example implementation, the proximity sensor 104 may be a capacitive sensor for detecting a presence of a nearby object, such as a human body.

In an example implementation of the present subject matter, the proximity sensor 104 may generate a detection signal. The detection signal is indicative of at least one of a state of the proximity sensor and a condition of the proximity sensor. For example, the state of the proximity sensor may indicate presence or absence of an object in the vicinity of the proximity sensor. That is, if an object is detected, the state of proximity sensor may be identified as triggered and if an object is not detected, the state of the proximity sensor may be identified as not-triggered. Similarly, the condition of the proximity sensor may indicate whether the proximity sensor is working properly, or has malfunctioned. In an example, the state of the proximity sensor 104 may be one of a triggered state and a non-triggered state and the condition of the proximity sensor 104 may be either malfunctioned or operational. It would be noted that the state of the proximity sensor 104 could be either triggered or not-triggered when the condition of the proximity sensor 104 is operational. However, when the condition of the proximity sensor 104 is malfunctioned, the state of the proximity sensor 104 would not be determined.

Further, the PSFU 106 may comprise multiple filter circuits, where each filter circuit may include a predefined set of resistors and capacitors. In an example implementation, each filter circuit may have a different discharging rate as compared to other filter circuit. Moreover, the PSFU 106 may receive and filter the detection signal. Upon receiving the detection signal, the PSFU 106 may also filter the detection signal to generate a control signal.

In an example implementation of the present subject matter, the control signal may be utilized by the WWAN controller 108 to regulate the RF output power of the antenna of the computing device.

In operation, according to the present subject matter, when the proximity sensor 104 detects a presence of a nearby object, such as a human body, the proximity sensor may generate the detection signal. For example, the proximity sensor 104 may get triggered when the nearby object, such as the human body, is within a predefined distance of the proximity sensor 104. The detection signal is thereafter received by the PSFU 106 and, upon receiving the detection signal, the PSFU 106 filters the detection signal to generate the control signal. Thereafter, the WWAN controller 108 receives the control signal and regulates the RF output power of the antenna of the computing device based on the control signal.

Figure 2:
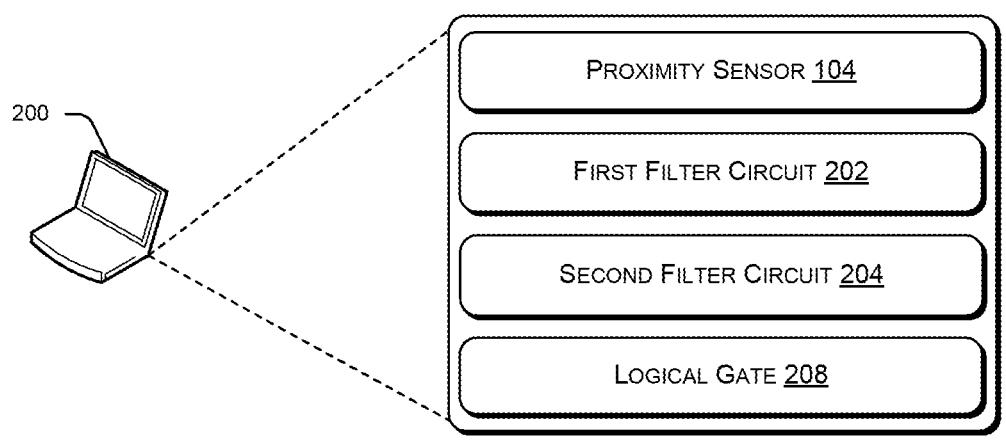
FIG. 2 illustrates a computing device comprising a system to regulate the RF output power of an antenna, according to an example implementation of the present subject matter.

FIG. 2 illustrates a computing device 200 where the RF output power of the antenna of the computing device 200 is controlled based on state and condition of the proximity sensor 104, according to an example implementation of the present subject matter. In an example implementation, the computing device 200 may be a desktop computer, a laptop, a smart phone, a portable computing system, a personal digital assistant (PDAs), a tablet, a special purpose computer, and/or any other type of computing system capable of communicating wirelessly through antennas. In an example implementation, the computing device 200 may implement the system 102 for regulating the RF output power of the antenna of the computing device 200. Further, in an example implementation, the computing device 200 may comprise the proximity sensor 104, a first filter circuit 202, a second filter circuit 204, and a logical gate 208. In an example implementation, the first filter circuit 202, the second filter circuit 204, and the logical gate 208 may be a part of the PSFU 106.

In an example implementation, each of the first filter circuit 202 and the second filter circuit 204 may be a low pass filter. Further, the first filter circuit 202 may have a first discharging rate and the second filter circuit 204 may have a second discharging rate. In said example implementation, the first discharging rate may be different from the second discharging rate. Further, in said example implementation, the first discharging rate may be higher than the second discharging rate. In an example implementation, the logical gate 208 may a logical AND gate. Furthermore, a detailed implementation of the computing device 200 and its various components has been explained with reference to the detailed in the forthcoming figure explanations.

Figure 3:
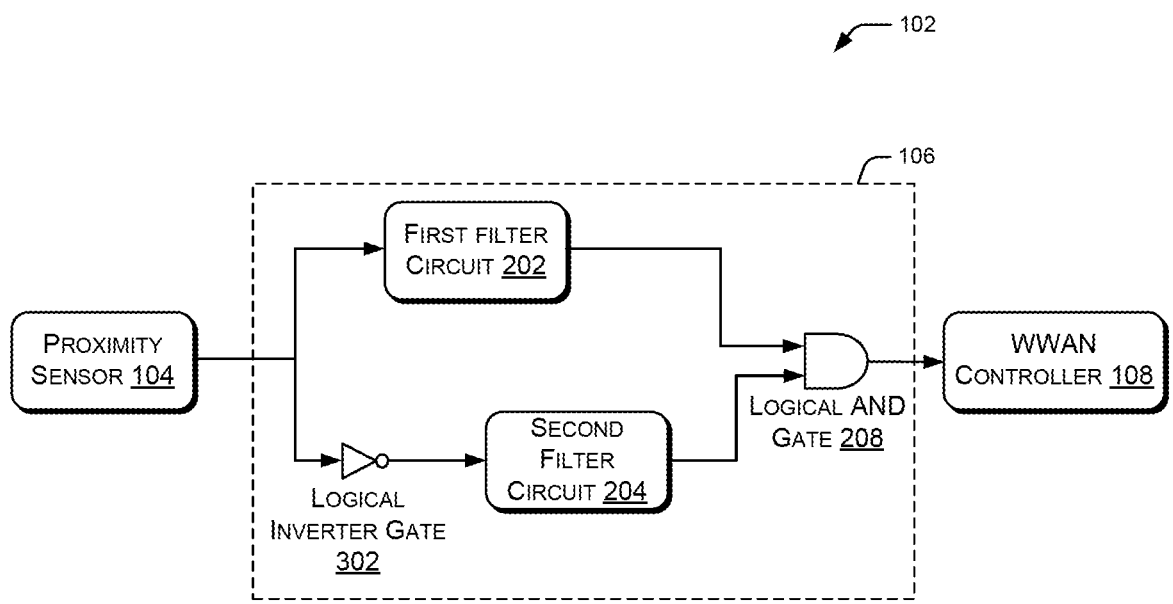
FIG. 3 illustrates a schematic view of a physical signal filter unit (PSFU), according to an example implementation of the present subject matter.

FIG. 3 illustrates a schematic view of the system 102, according to an example implementation of the present subject matter. As explained earlier, the system 102 may include the proximity sensor 104, the PSFU 106, and the WWAN controller 108. Further, in an example implementation, the PSFU 106 may include the first filter circuit 202, the second filter circuit 204, a logical inverter gate 302, and a logical AND gate 208.

In an example implementation of the present subject matter, the logical inverter gate 302 and the second filter circuit 204 may be communicatively coupled in series, such that the second filter circuit 204 receives an inverted detection signal from the logical inverter gate 302. Further, the first filter circuit 202 may be communicatively coupled in parallel to the logical inverter gate 302 and the second filter circuit 204. Furthermore, the logical AND gate 208 may be communicatively coupled to the first filter circuit 202 and the second filter circuit 204 to receive an output signal from each of the first filter circuit 202 and the second filter circuit 204. As explained earlier, the PSFU 106 may be communicatively coupled to the proximity sensor 104 to receive the detection signal generated by the proximity sensor 104. As described earlier, upon receiving the detection signal, the PSFU 106 may filter the detection signal to generate the control signal. Further, the WWAN controller 108 may receive the control signal and regulate the RF output power of the antenna of the computing device 200. For the sake of explanation, working and implementation of the PSFU 106 has been explained with reference to FIG. 4A and FIG. 4B.

Figure 4A:
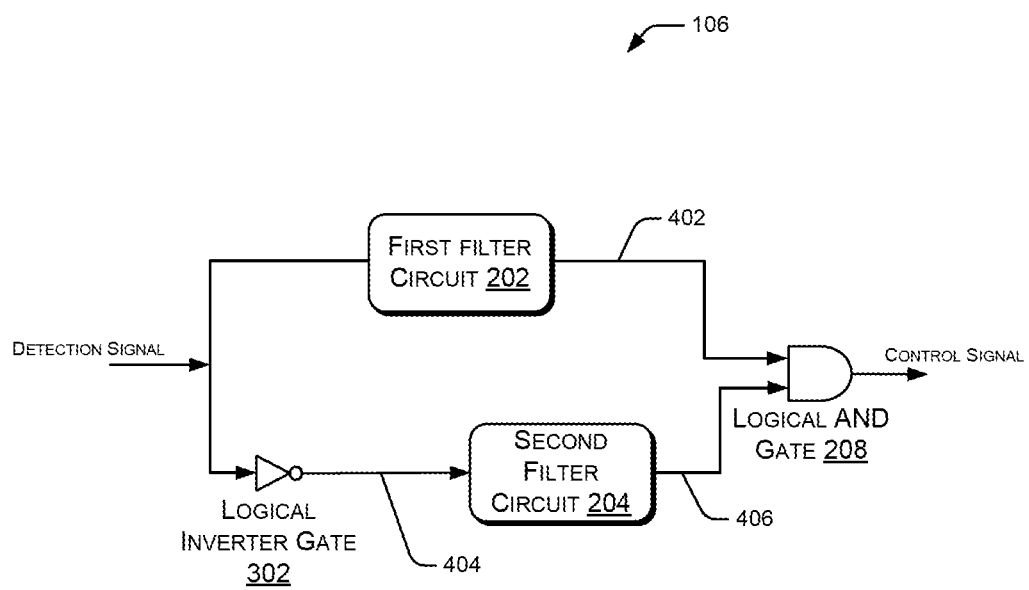
FIG. 4A illustrates a circuit of a PSFU, according to an example implementation of the present subject matter.

FIG. 4A illustrates an example circuit of the PSFU 106, according to an example implementation of the present subject matter. According to the example implementation, the PSFU 106 includes the first filter circuit 202, the second filter circuit 204, the logical inverter gate 302, and the logical AND gate 208.

In an example, the PSFU 106 may receive the detection signal from a sensor, such as the proximity sensor 104. The detection signal may be received by the first filter circuit 202 which may filter the detection signal to generate a first filter output signal (FFOS) 402. Further, the detection may be inverted by the logical inverter gate 302 to generate an inverted detection signal 404. The second filter circuit 204 may thereafter filter the inverted detection signal to generate a second filter output signal (SFOS) 406. In an example, the FFOS 402 and the SFOS 406 may be received by the logical AND gate 208 and the logical AND gate may perform a logical AND operation on the FFOS 402 and the SFOS 406 to generate the control signal. In an example, the control signal may be utilized by an antenna controller for controlling the RF output power of the antenna.

Figure 4B:
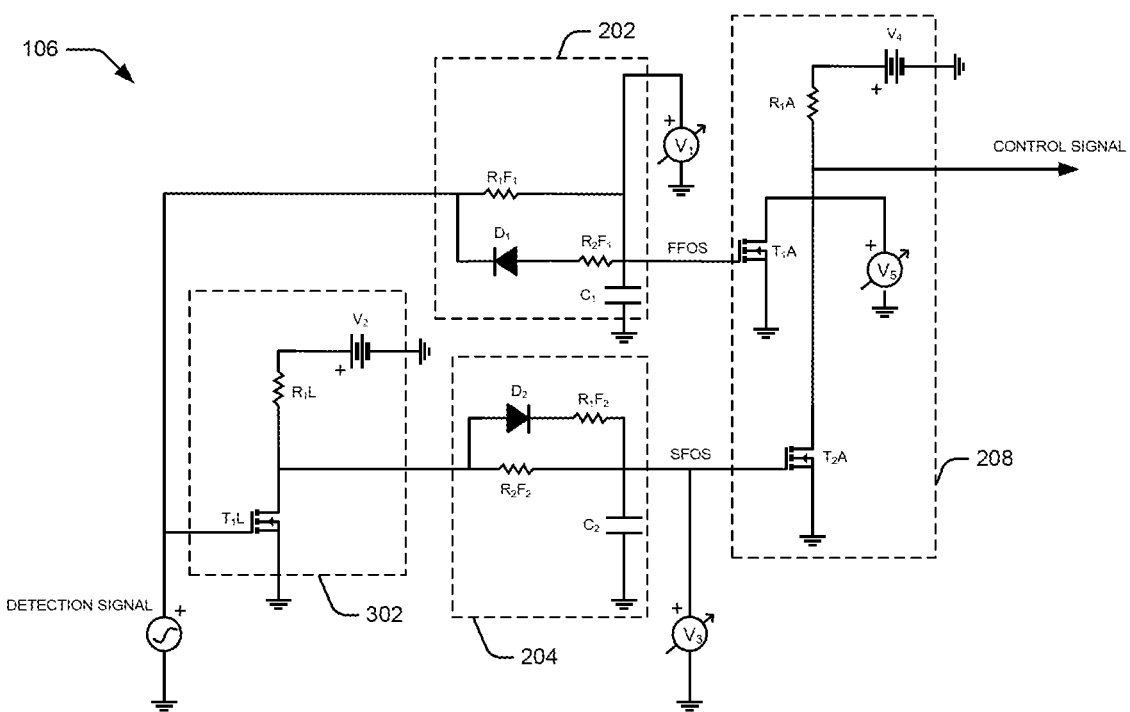
FIG. 4B illustrates a circuit of a PSFU, according to an example implementation of the present subject matter.

FIG. 4B illustrates an example circuit of the PSFU 106, according to an example implementation of the present subject matter. The example circuit of the PSFU 106 may comprise the first filter circuit 202, the second filter circuit 204, the logical inverter gate 302, and the logical AND gate 208. In an example implementation, each of the first filter circuit 202 and the second filter circuit 204 may be a low pass filter. Further, in said example implementation, the first filter circuit 202 may have a higher discharging rate than that of the second filter circuit 204.

In an example implementation, the first filter circuit 202 is a low pass filter and may include a predefined set of resistors and capacitors. For example, the first filter circuit 202 may include a first resistor ($R_1F_1$), a second resistor ($R_2F_1$), a diode ($D_1$), and a capacitor ($C_1$). In an example, $R_1F_1$ may have resistance of about 330 kΩ and $R_2F_1$ may have a resistance of about 0Ω. In said example, $C_1$ may have a capacitance of about 10 microfarad (μF). Further, in said example, the first filter circuit 202 may be powered by a variable voltage ($V_1$).

In an example implementation, the logical inverter gate 302 may include a transistor ($T_1L$), a resistor ($R_1L$), and a fixed voltage ($V_2$). In an example, the transistor ($T_1L$) may be an N-channel metal-oxide-semiconductor field-effect transistor (MOSFET). Further, the resistor $R_1L$ may have a resistance of about 10 kilo ohm (kΩ) and the fixed voltage $V_2$ may have a value of about 3.3 Volts (V).

Similarly, the second filter circuit 204 may also be a low pass filter and may include another predefined set of resistors and capacitors. In an example, the second filter circuit 204 may include a first resistor ($R_1F_2$), a second resistor ($R_2F_2$), a diode ($D_2$), and a capacitor ($C_2$). In an example, the resistor $R_1F_2$ may have resistance of about 330 kΩ and $R_2F_2$ may have a resistance of about 0Ω. Further, $C_2$ may have a capacitance of about 10 microfarad (μF). Furthermore, the second filter circuit 204 may be powered by a variable voltage ($V_3$). In said example implementation, the first filter circuit 202 may have a higher discharging rate than that of the second filter circuit 204.

In an example implementation, the logical AND gate 208 may include at least two transistors ($T_1A$ and $T_2A$), a resistor ($R_1A$), and a fixed voltage ($V_4$). In the example, each of the two transistors $T_1A$ and $T_2A$ may be N-channel MOSFETs. Further, the resistor $R_1A$ may have a resistance of about 1 kΩ and the fixed voltage $V_4$ of about 3.3 V. In said example, the logical AND gate 208 may be powered by a variable voltage ($V_5$).

As explained earlier, the PSFU 106 may receive the detection signal from the proximity sensor 104. The detection signal may be filtered by the first filter circuit 202 to generate the FFOS 402 while the logical inverter gate 302 may generate the inverted detection signal 404. For example, when the detection signal is a logical high signal, the inverted detection signal may be a logical low signal, and when the detection signal is a logical low signal, the inverted detection signal may be a logical high signal. Further, the second filter circuit 204 may filter the inverted detection signal 404 to generate the SFOS 406. In an example, the FFOS 402 and the SFOS 406 may be processed by the logical AND gate 208. The logical AND gate 208 may perform a logical AND operation on the FFOS 402 and the SFOS 406 to generate the control signal. The control signal may be utilized by the WWAN controller 108 for regulating the RF output power of the computing device 200.

As described earlier, the detection signal is indicative of the state and condition of the proximity sensor 104. That is, based on the state and condition of the proximity sensor 104, the characteristics of the detection signal may vary. Table 1 illustrates different states and conditions of the proximity sensor 104 along with characteristics of the FFOS 402, the SFOS 406, the control signal, and the RF output power based on the filtering performed by the PSFU 106.

TABLE 1

| State or Condition of the proximity sensor 104 | First filter output signal | Second filter output signal | Control signal | RF output power |
|---|---|---|---|---|
| Non-triggered state of the proximity sensor 104 | Logical high | Logical high | Logical high | high |
| Triggered state of the proximity sensor 104 | Logical low | Logical high | Logical low | low |
| Malfunctioned condition of the proximity sensor 104 | Logical high | Logical low | Logical low | low |
| Malfunctioned condition of the proximity sensor 104 | Logical low | Logical high | Logical low | low |

The above represented Table 1 illustrates characteristics of the FFOS 402, the SFOS 406, the control signal, and the RF output power of the antenna for various conditions and states of the proximity sensor 104. For instance, in an example situation when the proximity sensor 104 is in a triggered state by the presence an object, such as a human body, within the predefined distance of the proximity sensor 104, and the condition of the proximity sensor 104 is operational, the proximity sensor 104 may generate a logical low signal with intermittent logical high pulses. Such a detection signal may therefore be filtered by the PSFU 106 to generate the control signal. In such example, the FFOS 402 may be a logical low signal along with a logical high SFOS 406. Correspondingly, the control signal may also be a logical low signal and the RF output power of the antenna may be low or curtailed.

For the ease of explanation, the characteristics of the FFOS 402, the SFOS 406, the control signal, and the RF output power in different states and conditions of the proximity sensor 104 are explained in reference of graphs, as depicted in FIG. 5 to FIG. 8.

Figure 5:
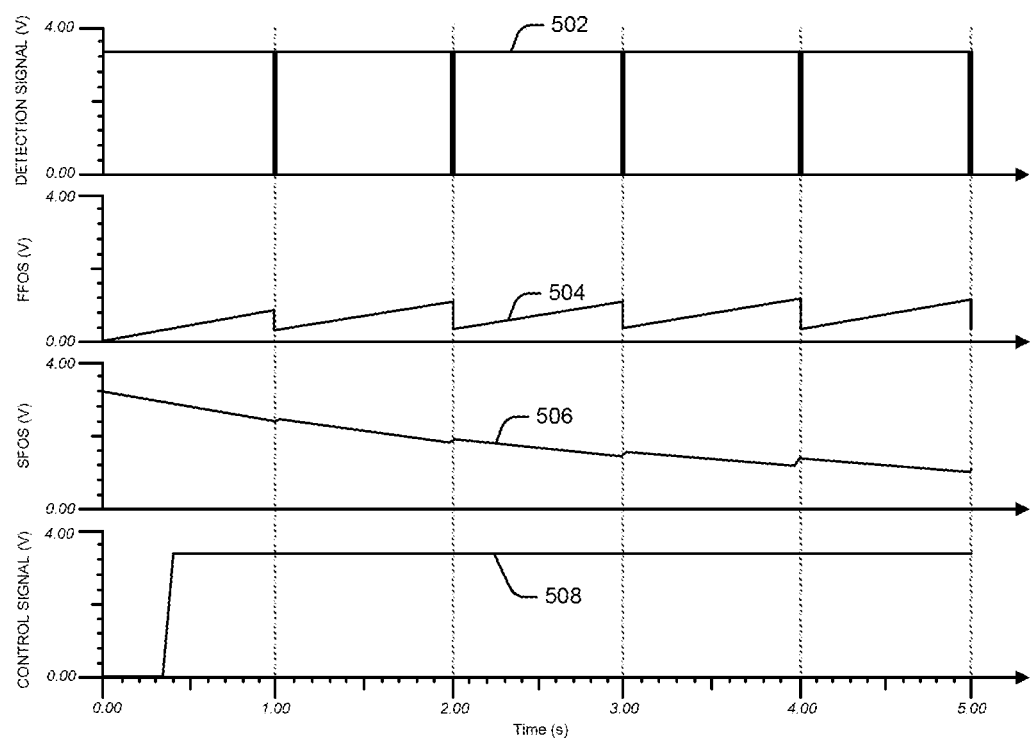
FIG. 5 illustrates different signal waveforms when a proximity sensor is in a non-triggered state, according to an example implementation of the present subject matter.

FIG. 5 describes different graphs depicting characteristics of the FFOS 402, the SFOS 406, and the control signal in response to the detection signal generated by the proximity sensor 104. The graphs depict the characteristics of the signals when the proximity sensor 104 is in a non-triggered state and the condition of the proximity sensor is operational.

The Y-axis of each graph depicts an output value of a signal while the X-axis of each graph depicts time. Referring to FIG. 5, signal 502 depicts the detection signal when the proximity sensor is non-triggered, i.e., when there is no detection of an object within the predetermined distance of the proximity sensor 104. The detection signal in such a situation is a logical high signal with impulses of logical low values. The detection signal is logical high due to non-triggered state of the proximity sensor 104, and the impulses of the logical low values depict the operational condition of the proximity sensor 104.

In such condition, the detection signal is filtered by the first filter circuit 202 to generate the FFOS 402. In an example, the first filter circuit 202 is a low pass filter and therefore, the logical high detection signal is filtered by the first filter circuit 202 to generate a logical high FFOS 402, as depicted by 504.

Similarly, signal 506 depicts the SFOS 406, as generated by the second filter circuit 204. In operation, the logical high detection signal is received by the logical inverter gate 302 which inverts the logical high detection signal with impulses of logical low values into a logical low signal 404 with impulses of logical high values. The second filter circuit 204 may filter the inverted detection signal to generate the logical high SFOS 406, as depicted by signal 506. It would be noted that since the second filter circuit 204 has a lower discharging rate than that of the first filter circuit 202, the SFOS 406 generated by the second filter circuit 204 doesn't lose its value rapidly. Therefore, the SFOS 406 generated by the second filter circuit 204 is a logical high signal.

In the described situation, since the FFOS 402 and the SFOS 406 are subjected to a logical AND operation, the control signal generated by the logical AND gate 208 is a logical high signal. A logical high control signal may allow the WWAN controller 108 to operate the antenna of the computing device 200 at a full RF output power.

Therefore, it would be noted that when the proximity sensor is in a non-triggered state due to no object in the vicinity of the proximity sensor 104, and is in an operational condition, the antenna of the computing device 200 is operated at the full RF output power.

Figure 6:
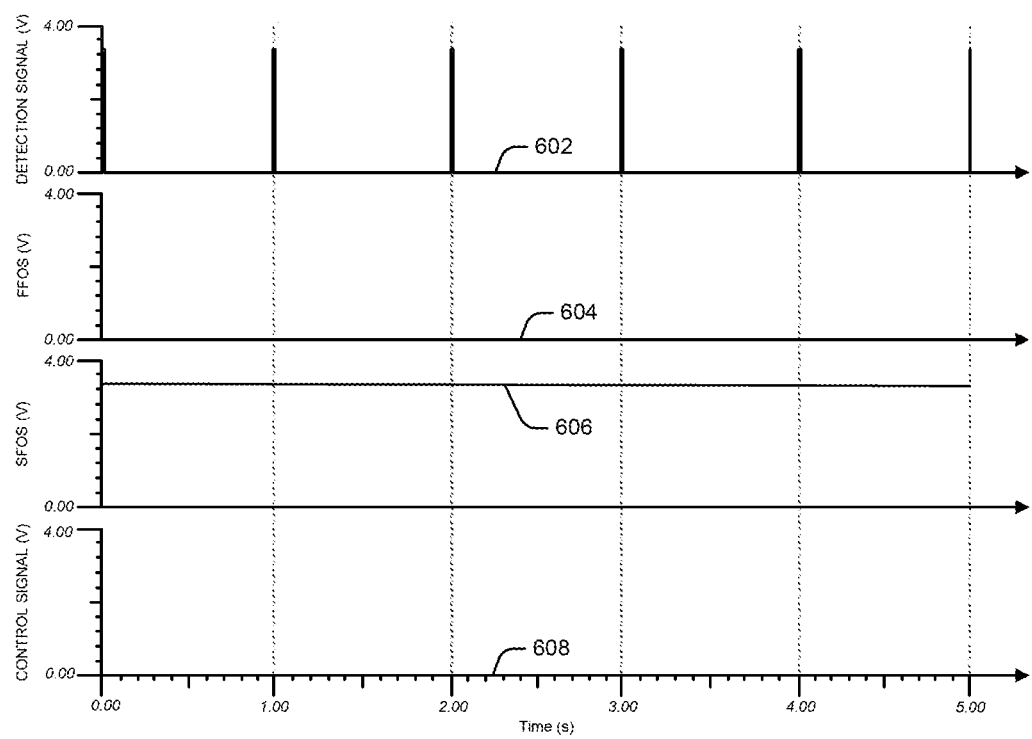
FIG. 6 illustrates different signal waveforms when a proximity sensor is in a triggered state, according to an example implementation of the present subject matter.

FIG. 6 describes different graph depicting characteristics of the FFOS 402, the SFOS 406, and the control signal in response to the detection signal generated by the proximity sensor 104. The graphs depict the characteristics of the signals when the proximity sensor 104 is in a triggered state and the condition of the proximity sensor is operational.

Referring to FIG. 6, signal 602 depicts the detection signal when the proximity sensor is triggered, i.e., when there is detection of an object within the predetermined distance of the proximity sensor 104. The detection signal in such a situation is a logical low signal with impulses of logical high values. The detection signal is logical low due to triggered state of the proximity sensor 104, and the impulses of the logical high values depict the operational condition of the proximity sensor 104.

In such condition, the detection signal is filtered by the first filter circuit 202 to generate the FFOS 402. In an example, the first filter circuit 202 is a low pass filter and the logical low detection signal is filtered by the first filter circuit 202 to generate a logical low FFOS 402, as depicted by signal 604.

Similarly, signal 606 depicts the SFOS 406, as generated by the second filter circuit 204. In operation, the logical low detection signal is received by the logical inverter gate 302 which inverts the logical low detection signal with impulses of logical high values into a logical high signal 404 with impulses of logical low values. The second filter circuit 204 may filter the inverted detection signal to generate the logical high SFOS 406, as depicted by signal 606.

In the described situation, since the FFOS 402 and the SFOS 406 are subjected to a logical AND operation, the control signal generated by the logical AND gate 208 is a logical low signal. A logical low control signal may allow the WWAN controller 108 to operate the antenna of the computing device 200 at a low or curtailed RF output power.

Therefore, it would be noted that when the proximity sensor is in a triggered state due to presence of an object in the vicinity of the proximity sensor 104, and is in an operational condition, the antenna of the computing device 200 is operated at curtailed RF output power.

Figure 7:
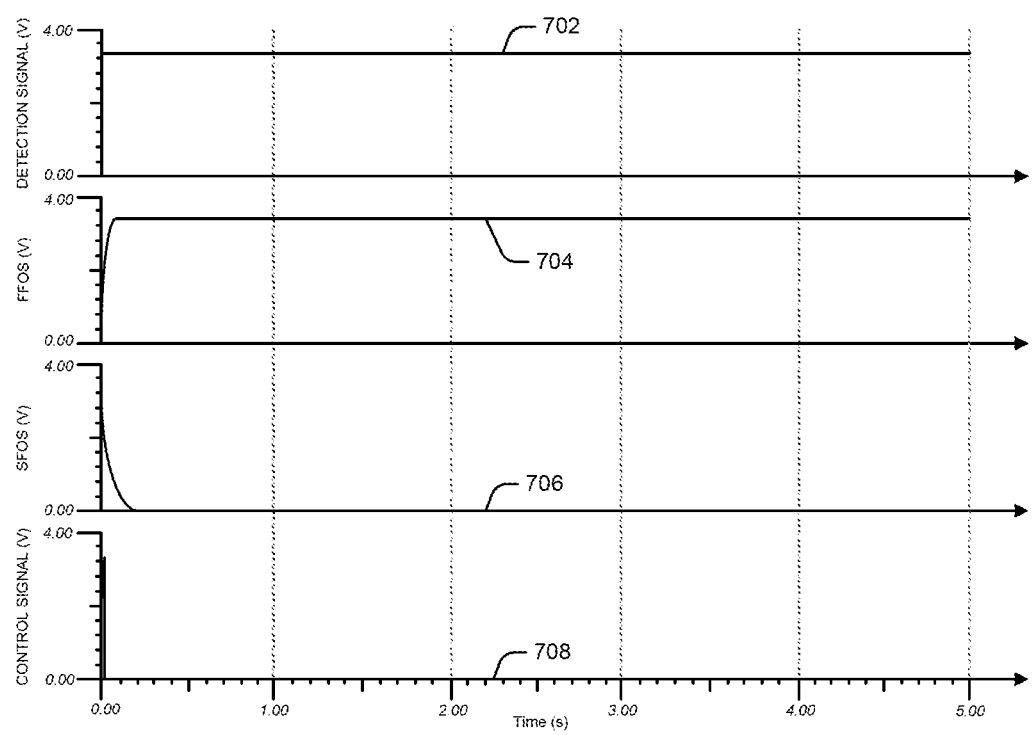
FIG. 7 illustrates different signal waveforms when a proximity sensor is in a malfunctioned condition, according to an example implementation of the present subject matter.
Figure 8:
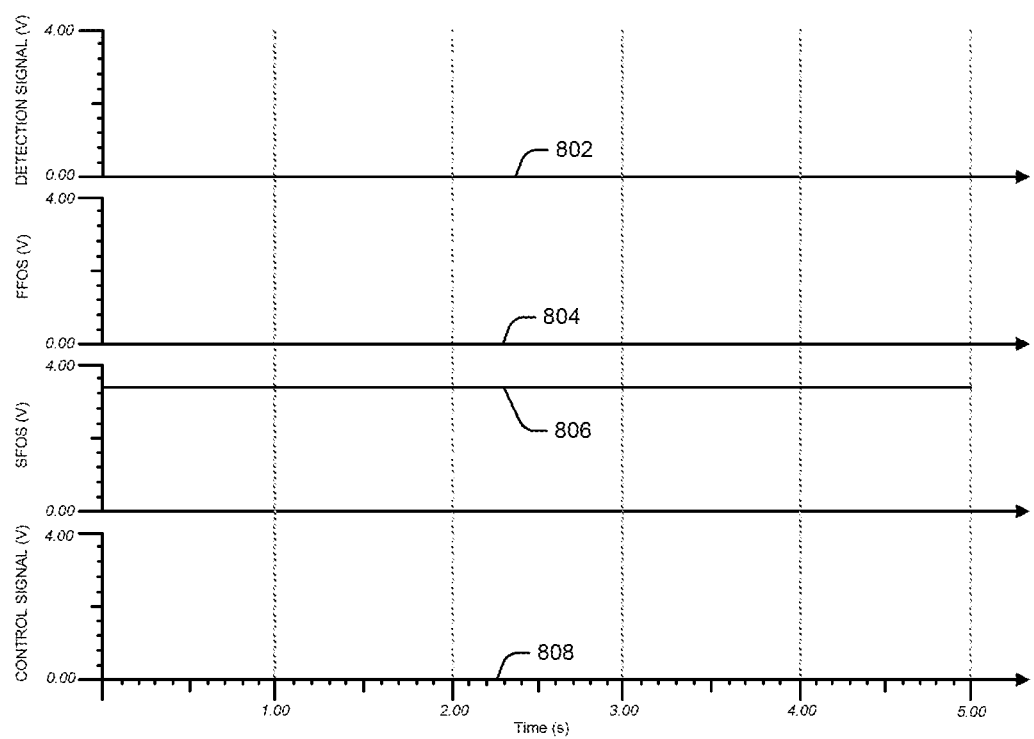
FIG. 8 illustrates different signal waveforms when a proximity sensor is in a malfunctioned condition, according to an example implementation of the present subject matter.

FIG. 7 and FIG. 8 describe different graph depicting characteristics of the FFOS 402, the SFOS 406, and the control signal in response to the detection signal generated by the proximity sensor 104 when the proximity sensor 104 is in a malfunctioned condition. It would be noted that when the proximity sensor 104 is in a malfunctioned condition, the detection signal generated by the proximity sensor 104 may either be a logical high, or a logical low.

Referring to FIG. 7, signal 702 depicts the detection signal when the proximity sensor 104 is in a malfunctioned condition and the detection signal generated by the proximity sensor 104 is a logical high signal. The absence of any impulses of either logical high or logical low values in the detection state may indicate that the malfunctioned condition of the proximity sensor 104.

In such condition, the detection signal is filtered by the first filter circuit 202 to generate a logical high FFOS 402, as depicted by signal 704. Similarly, signal 706 depicts the SFOS 406, as generated by the second filter circuit 204.

In operation, the logical high detection signal is received by the logical inverter gate 302 which inverts the logical high detection signal into a logical low signal. The second filter circuit 204 may accordingly filter the inverted logical low detection signal to generate the logical low SFOS 406, as depicted by signal 706.

In the described situation, since the FFOS 402 and the SFOS 406 are subjected to a logical AND operation, the control signal generated by the logical AND gate 208 is a logical low signal. A logical low control signal may allow the WWAN controller 108 to operate the antenna of the computing device 200 at a low or curtailed RF output power.

Therefore, it would be noted that when the proximity sensor is in a malfunctioned condition, the antenna of the computing device 200 is operated at curtailed RF output power.

Referring to FIG. 8, signal 802 depicts the detection signal when the proximity sensor 104 is in a malfunctioned condition and the detection signal generated by the proximity sensor 104 is a logical low signal. As described earlier, the absence of any impulses of either logical high or logical low values in the detection state may indicate that the malfunctioned condition of the proximity sensor 104.

In such condition, the detection signal is filtered by the first filter circuit 202 to generate a logical low FFOS 402, as depicted by signal 804. Similarly, signal 806 depicts the SFOS 406, as generated by the second filter circuit 204.

In operation, the logical low detection signal is received by the logical inverter gate 302 which inverts the logical low detection signal into a logical high signal. The second filter circuit 204 may accordingly filter the inverted logical high detection signal to generate the logical high SFOS 406, as depicted by signal 806.

In the described situation, since the FFOS 402 and the SFOS 406 are subjected to a logical AND operation, the control signal generated by the logical AND gate 208 is a logical low signal. A logical low control signal may allow the WWAN controller 108 to operate the antenna of the computing device 200 at a low or curtailed RF output power.

Therefore, it would be noted that when the proximity sensor is in a malfunctioned condition, the antenna of the computing device 200 is operated at curtailed RF output power.

Hence, it would be noted that in situation when the proximity sensor 104 is in a non-triggered state and is in an operational condition, the antenna of the computing device 200 is operated at full RF output power. In all other situations, the antenna of the computing device 200 is operated at a curtailed or low RF output power to ensure safety of the users. That is, even when the proximity sensor 104 is in a malfunctioned condition, the RF output power of the antenna is curtailed.

Figure 9:
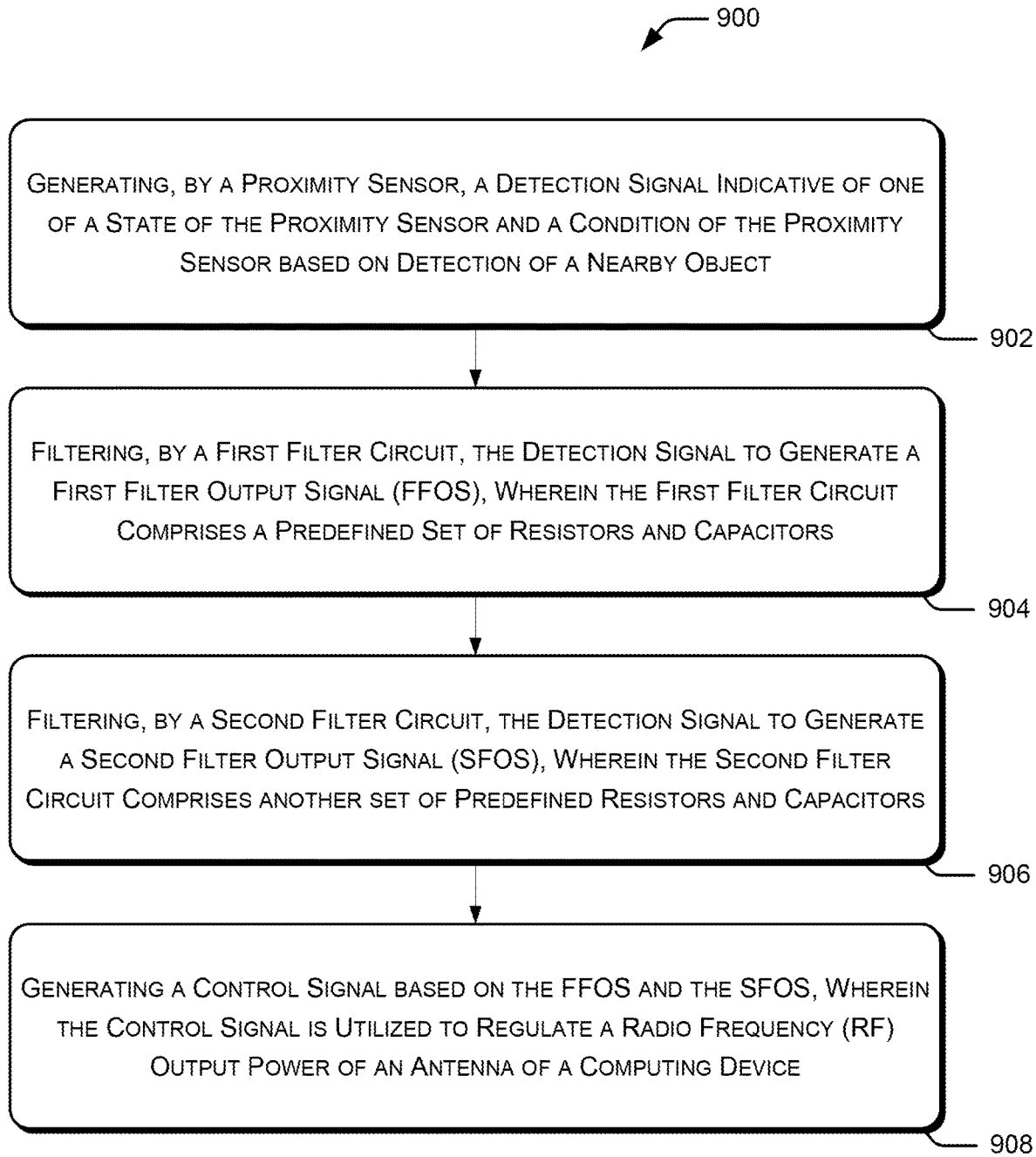
FIG. 9 illustrates a method of regulating the RF output power of an antenna, according to an example implementation of the present subject matter.

FIG. 9 illustrates a method 900 to regulate the RF output power of an antenna of a computing device. The order in which the method 900 is described is not intended to be construed as a limitation, and any number of the described method blocks may be combined in any order to implement the method 900, or an alternative method. Furthermore, the method 900 may be implemented by electronic circuits, or processor(s) through any suitable hardware, or combination thereof.

Referring to FIG. 9, in an example implementation of the present subject matter, at block 902, a detection signal is generated by the proximity sensor, the detection signal being indicative of at least one of a state of the proximity sensor and a condition of the proximity sensor based on detection of a nearby object.

At block 904, the detection signal is filtered by the first filter circuit to generate a first filter output signal (FFOS), the first filter circuit comprising a predefined set of resistors and capacitors.

At block 906, the detection signal is filtered by the second filter circuit to generate a second filter output signal (SFOS), the second filter circuit comprising another predefined set of resistors and capacitors.

At block 908, the control is generated based on the FFOS and the SFOS, where the control signal may be utilized to regulate the RF output power of an antenna of the computing device.

Although implementations of present subject matter have been described in language specific to structural features and/or methods, it is to be understood that the present subject matter is not necessarily limited to the specific features or methods described. Rather, the specific features and methods are disclosed and explained in the context of a few implementations for the present subject matter.

We claim:

1. An apparatus for regulating a radio frequency (RF) output power of an antenna, the apparatus comprising:
   a proximity sensor to detect a presence of a nearby object, the proximity sensor to output a detection signal, wherein the proximity sensor is to generate the detection signal with signal pulses when the proximity sensor is triggered in response to the proximity sensor being operational, and the detection signal has a first logical state with signal pulses of a second logical state responsive to the proximity sensor being operational and in a triggered state when detecting the presence of the nearby object;
   a physical signal filter unit (PSFU) comprising a plurality of filters and to:
      filter the detection signal to produce respective filtered detection signals, wherein a combination of states of the filtered detection signals indicates that the proximity sensor is in a malfunctioned condition, and
      generate a control signal based on the filtered detection signals; and
   a network controller to control the RF output power of the antenna based on the control signal.

2. The apparatus of claim 1, wherein the detection signal has the second logical state with signal pulses of the first logical state responsive to the proximity sensor being operational and being in a non-triggered state when the nearby object is not present.

3. The apparatus of claim 2, wherein the PSFU is to set the control signal to an inactive state responsive to a combination of further states of the filtered detection signals indicating that the proximity sensor is operational and in the non-triggered state, and the network controller is to operate the antenna at an elevated RF output power based on the control signal being at the inactive state.

4. The apparatus of claim 1, wherein the proximity sensor is to generate the detection signal without signal pulses when the proximity sensor is in the malfunctioned condition.

5. The apparatus of claim 4, wherein the PSFU is to set the control signal to an active state based on the combination of the states of the filtered detection signals indicating that the proximity sensor is in the malfunctioned condition, and the network controller is to operate the antenna at a reduced RF output power based on the control signal being at the active state.

6. The apparatus of claim 1, wherein the plurality of filters comprises:
   a first filter to filter the detection signal to generate a first filter output signal, wherein the first filter has a first discharging rate;
   a second filter to filter the detection signal to generate a second filter output signal, wherein the second filter has a second discharging rate different from the first discharging rate, and
   wherein the PSFU further comprises a logical gate to generate the control signal based on the first filter output signal and the second filter output signal.

7. The apparatus of claim 6, wherein each of the first filter and the second filter is a low pass filter.

8. A computing device comprising:
   an antenna
   a proximity sensor to detect a presence of a nearby object, the proximity sensor to output a detection signal, wherein the proximity sensor is to generate the detection signal with signal pulses when the proximity sensor is triggered in response to the proximity sensor being operational, and the detection signal has a first logical state with signal pulses of a second logical state responsive to the proximity sensor being operational and in a triggered state when detecting the presence of the nearby object;

a physical signal filter unit (PSFU) comprising a plurality of filters and to:
   filter the detection signal to produce respective filtered detection signals, wherein a combination of states of the filtered detection signals indicates that the proximity sensor is in a malfunctioned condition, and
   generate a control signal based on the filtered detection signals; and
a network controller to control a radio frequency (RF) output power of the antenna based on the control signal.

9. The computing device of claim 8, wherein the detection signal has the second logical state with signal pulses of the first logical state responsive to the proximity sensor being operational and being in a non-triggered state when the nearby object is not present.

10. The computing device of claim 9, wherein the PSFU is to set the control signal to a first state responsive to a combination of further states of the filtered detection signals indicating that the proximity sensor is operational and in the non-triggered state, and the network controller is to operate the antenna at an elevated RF output power based on the control signal being at the first state.

11. The computing device of claim 8, wherein the proximity sensor is to generate the detection signal without signal pulses when the proximity sensor is in the malfunctioned condition.

12. The computing device of claim 11, wherein the PSFU is to:
   set the control signal to a first state responsive to a combination of further states of the filtered detection signals indicating that the proximity sensor is operational and in a non-triggered state, and the network controller is to operate the antenna at an elevated RF output power based on the control signal being at the first state, and
   set the control signal to a second state based on the combination of the states of the filtered detection signals indicating that the proximity sensor is in the malfunctioned condition, and the network controller is to operate the antenna at a reduced RF output power based on the control signal being at the second state.

13. The computing device of claim 8, wherein the plurality of filters comprises:
   a first filter to filter the detection signal to generate a first filter output signal, wherein the first filter has a first discharging rate;
   a second filter to filter the detection signal to generate a second filter output signal, wherein the second filter has a second discharging rate different from the first discharging rate, and
   wherein the PSFU further comprises a logical gate to generate the control signal based on the first filter output signal and the second filter output signal.

14. The computing device of claim 13, wherein each of the first filter and the second filter is a low pass filter.

15. A method comprising:
outputting, by a proximity sensor for detecting a presence of a nearby object, a detection signal;
filtering, by a plurality of filters in a physical signal filter unit (PSFU), the detection signal to produce respective filtered detection signals, wherein a combination of states of the filtered detection signals indicates that the proximity sensor is in a malfunctioned condition, wherein the plurality of filters comprises:
   a first filter to filter the detection signal to generate a first filter output signal, wherein the first filter has a first discharging rate, and
   a second filter to filter the detection signal to generate a second filter output signal, wherein the second filter has a second discharging rate different from the first discharging rate;
generating, by a logical gate of the PSFU, a control signal based on the first filter output signal and the second filter output signal; and
controlling, by a network controller, a radio frequency (RF) output power of an antenna based on the control signal.

16. The method of claim 15, comprising:
generating, by the proximity sensor, the detection signal with signal pulses when the proximity sensor is triggered in response to the proximity sensor being operational;
generating, by the proximity sensor, the detection signal without signal pulses when the proximity sensor is in the malfunctioned condition;
setting, by the PSFU, the control signal to a first state responsive to a combination of further states of the filtered detection signals indicating that the proximity sensor is operational and in a non-triggered state when the nearby object is not present;
operating, by the network controller, the antenna to an elevated RF output power based on the control signal being at the first state;
setting, by the PSFU, the control signal to a second state based on the combination of the states of the filtered detection signals indicating that the proximity sensor is in the malfunctioned condition; and
operating, by the network controller, the antenna at a reduced RF output power based on the control signal being at the second state.

* * * * *